United States Patent [19]

Brunin et al.

[11] Patent Number: 4,495,626
[45] Date of Patent: Jan. 22, 1985

[54] METHOD AND NETWORK FOR IMPROVING TRANSMISSION OF DATA SIGNALS BETWEEN INTEGRATED CIRCUIT CHIPS

[75] Inventors: Armand Brunin, Le Mee; Guy D'Hervilly, Ris-Orangis, both of France

[73] Assignee: International Business Machines Corporation, Armonk, N.Y.

[21] Appl. No.: 391,813

[22] Filed: Jun. 24, 1982

[30] Foreign Application Priority Data

Jun. 25, 1981 [EP] 06251981 .................. 81430018.2

[51] Int. Cl.³ ............................................. H04L 25/34
[52] U.S. Cl. ...................................................... 375/19
[58] Field of Search ................ 375/17, 19; 371/56; 361/245, 246; 178/69 R, 69 M; 307/236, 242, 262; 340/347 DD

[56] References Cited

U.S. PATENT DOCUMENTS

| | | | |
|---|---|---|---|
| 3,535,552 | 10/1970 | Warren | 307/262 |
| 3,560,856 | 2/1971 | Kaneko | 375/19 |
| 3,624,414 | 11/1971 | Dijk | 307/262 |
| 3,805,254 | 4/1974 | Schuur | 340/172.5 |
| 3,911,395 | 10/1975 | Koike | 371/56 |

FOREIGN PATENT DOCUMENTS 1277305 6/1972 United Kingdom .

OTHER PUBLICATIONS

Wooley et al., "An Integrated m-Out-Of-n Detection Circuit Using Threshold Logic", *IEEE Journal of Solid State Circuits*, 10/74, vol. SC-9, No. 5, 297–306.

*Primary Examiner*—Benedict V. Safourek
*Attorney, Agent, or Firm*—John A. Jordan

[57] ABSTRACT

A method and electronic network for limiting the electrical noise arising during transmission of digital data signals from a first integrated circuit having multiple output devices at which the data signals are formed to the input of a second integrated circuit. The method and network feature steps and means for sensing the conduction state of the first integrated circuit devices and for generating a control signal to invert the data signals before transmission when the number of output devices conducting is equal to or greater than a predetermined number. The method and network also feature steps and means for transmitting the data signals and control signal so that the data signals may be reconstituted to establish the data signals as they appear at the first integrated circuit output, before the data signals are presented to the second integrated circuit input.

13 Claims, 6 Drawing Figures

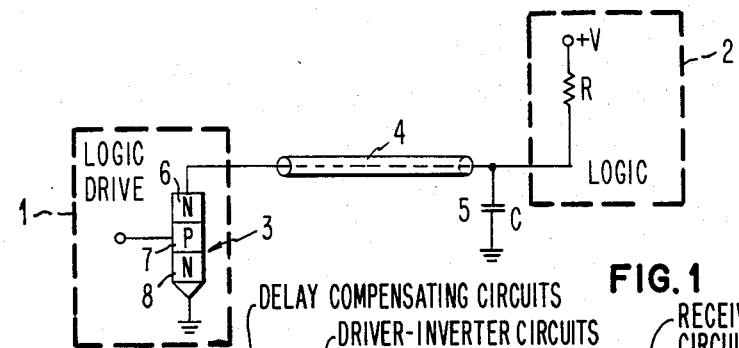
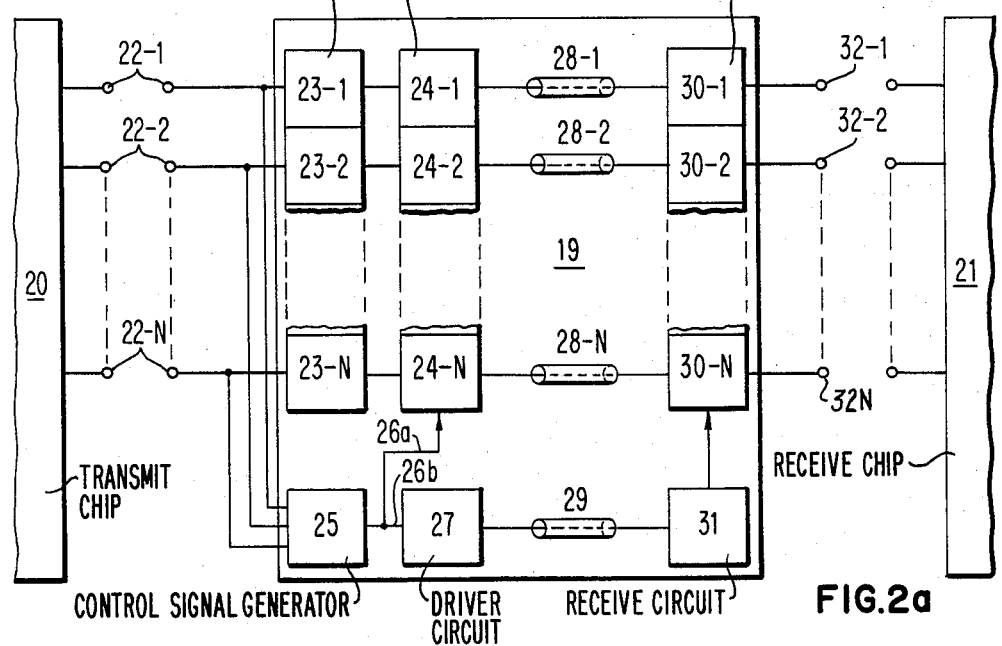
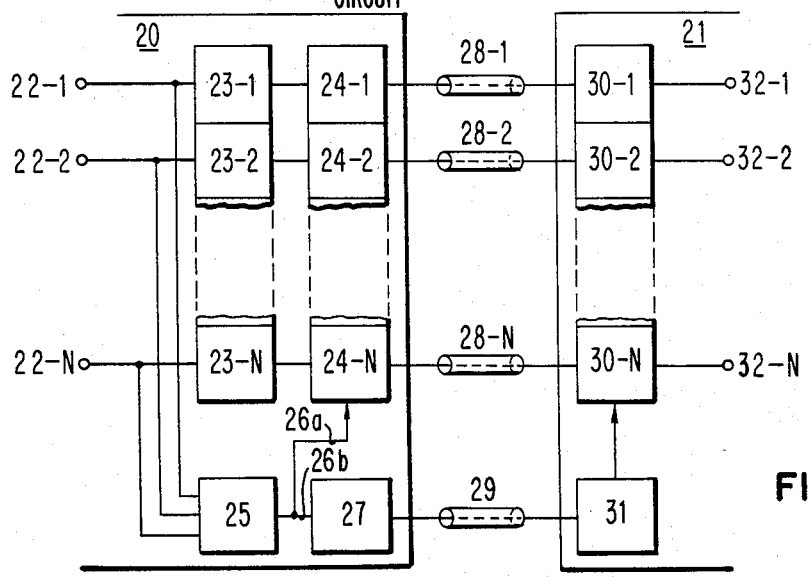

METHOD AND NETWORK FOR IMPROVING TRANSMISSION OF DATA SIGNALS BETWEEN INTEGRATED CIRCUIT CHIPS

BACKGROUND OF INVENTION

1. Field of Invention

Our invention relates generally to the transmission of digital data signals from one integrated circuit chip to another and more particularly to a method and electronic network for limiting electrical noise arising during the transmission.

2. Description of Prior Art

As is well known in the data processing art, information may be represented within the processing equipment as digital data words composed of a series of data bits. The bits are in actuality high and low electrical signal levels which are produced by controlling the conduction state of semiconductor elements such as bipolar transistors, field effect transistors, diodes, etc. These semiconductor elements are typically found in integrated circuit chips, the chips being interconnected to carry out the desired processing. In this arrangement, it is common to have the circuits of a first chip perform one or more operation, as for example logic functions, on a data word and to thereafter forward the data word i.e., bits to a second chip for further processing.

Workers have found that difficulties can arise in the course of transmitting data words from a first very large scale integrated (VLSI) circuit chip termed for convenience the "transmit chip" to a second VLSI chip, termed for convenience the "receive chip". Particularly, the ability of the chip interconnections to forward bits i.e., signals, without distortion may be exceeded. It has been found that if the multiple output devices which produce the transmit chip output signals are simultaneously switched to the conduction state i.e., switched to low resistance, the resulting currents contributed by the distributed capacitance of the interconnections may adversely affect the accuracy of the transmitted word. The capacitive currents contributed by the interconnection act as electrical noise which modifies the transmitted signal levels.

Workers have found that one approach to this problem is to prevent all of the output devices of the transmit chip from simultaneously switching to the conduction state. In this way, the capacitive currents contributed by the interconnections are maintained at an acceptable level. However, this approach has drawbacks. Particularly, by constraining the output devices, more time is required to fully transmit signals between chips.

An alternative to constraining the conduction state of the transmit chip output devices is to provide interconnections between chips of dimensions which minimized the distributive capacitance e.g., increased spacing between conductive elements. Unfortunately, however, due to size limitations necessary to achieve the high component packing density of VLSI circuits it has been found impractical to make the interconnections of larger spacing. In fact, continuing pressure by designers to increase component packing density has encouraged further limitation of interconnection size, thus aggravating the problem.

SUMMARY OF INVENTION

It is therefore an objective of our invention to provide a method for transmitting signals between very large scale integrated circuit chips which limits the noise created when the data is transmitted.

Further, it is an objective of our invention to provide an electronic network for facilitating transmission of data signals between large scale integrated circuit chips which limits noise created during transmission.

Briefly, our invention concerns a method for transmitting data words from the multiple outputs of a transmitting chip to the companion multiple inputs of a receiving chip such that the bits i.e., signal levels, transmitted are dependent upon the conduction states of the transmit chip output devices. Particularly, the method features analysis of the simltaneously arising transmit chip output word i.e., signal levels, to determine if the signal levels should be transmitted, inverted or uninverted; transmission of the signal levels to the receive chip in accordance with the analysis; receipt of the transmitted signal levels at the receive chip; and where the signal levels have been inverted for transmission, reinverting the received signal levels to establish the signal levels at the receive chip as they originally existed at the transmit chip.

In accordance with our invention, an electronic network for implementing our method includes a first circuit for generating a control signal responsive to the output signals simultaneously appearing at the transmit chip; a second circuit for transmitting the output signals received from the transmit chip either inverted or uninverted in response to the control signal; a third circuit for receiving the signals of the second circuit and forwarding them to the receive chip either as received or further inverted in response to the control signal and a fourth circuit for communicating the output signal and the control signal from the second circuit to the third circuit. In preferred form, the first and second circuits are located at the transmit chip while the third circuit is located at the receive chip with the fourth circuit being a conventional circuit for coupling the signals of the transmit chip to the receive chip.

More particularly, the first circuit acts as a control signal generator and includes N inputs electrically connected to the N outputs of the transmit chip. The control signal generator has a single output capable of producing a signal having two levels. The first level represents a command to invert the output signals of the transmit chip and the second level represents a command to transmit the output signals of the transmit chip without modification. The second circuit acts as a driver-inverter and includes N inputs electrically in communication with the N outputs of the transmit chip and to the output of the control signal generator circuit. Additionally, the driver-inverter has N outputs for providing the N signal levels unmodified or inverted depending upon the state of the control signal. The second circuit also acts as a driver for transmitting the control signal. The third circuit acts as a receiver-inverter and has N+1 inputs. The receiver-inverter circuit is configured to receive the N outputs of the transmit chip circuit and one input to receive the control signal. The receiver-inverter circuit has N outputs electrically connected to the N inputs of the receive chip for providing the receive chip the output signals of the transmit chip corrected for any inversion occasioned by the driver-inverter (i.e., the original state of the transmit chip output signals). The fourth circuit acts as an interconnection circuit and electrically connects the N outputs of the driver-inverter circuit and the control signal to the N+1 inputs of the receiver-inverter circuit and in the preferred embodiment may be the conventional connection for coupling the transmit and receive chips.

BRIEF DESCRIPTION OF THE DRAWINGS

Other objectives and features of our invention will become clear from the following description of a preferred form of the invention taken in conjunction with the drawings wherein:

FIG. 1 is a schematic illustration of the transmission of data between very large scale integrated circuits as known in the prior art.

FIG. 2a is a block diagram of an electronic network for implementing the transmission of data in accordance with our invention.

FIG. 2b is a block diagram of a further form of an electronic network for implementing the transmission of data in accordance with our invention.

DESCRIPTION OF THE PREFERRED EMBODIMENT

Figure 3:
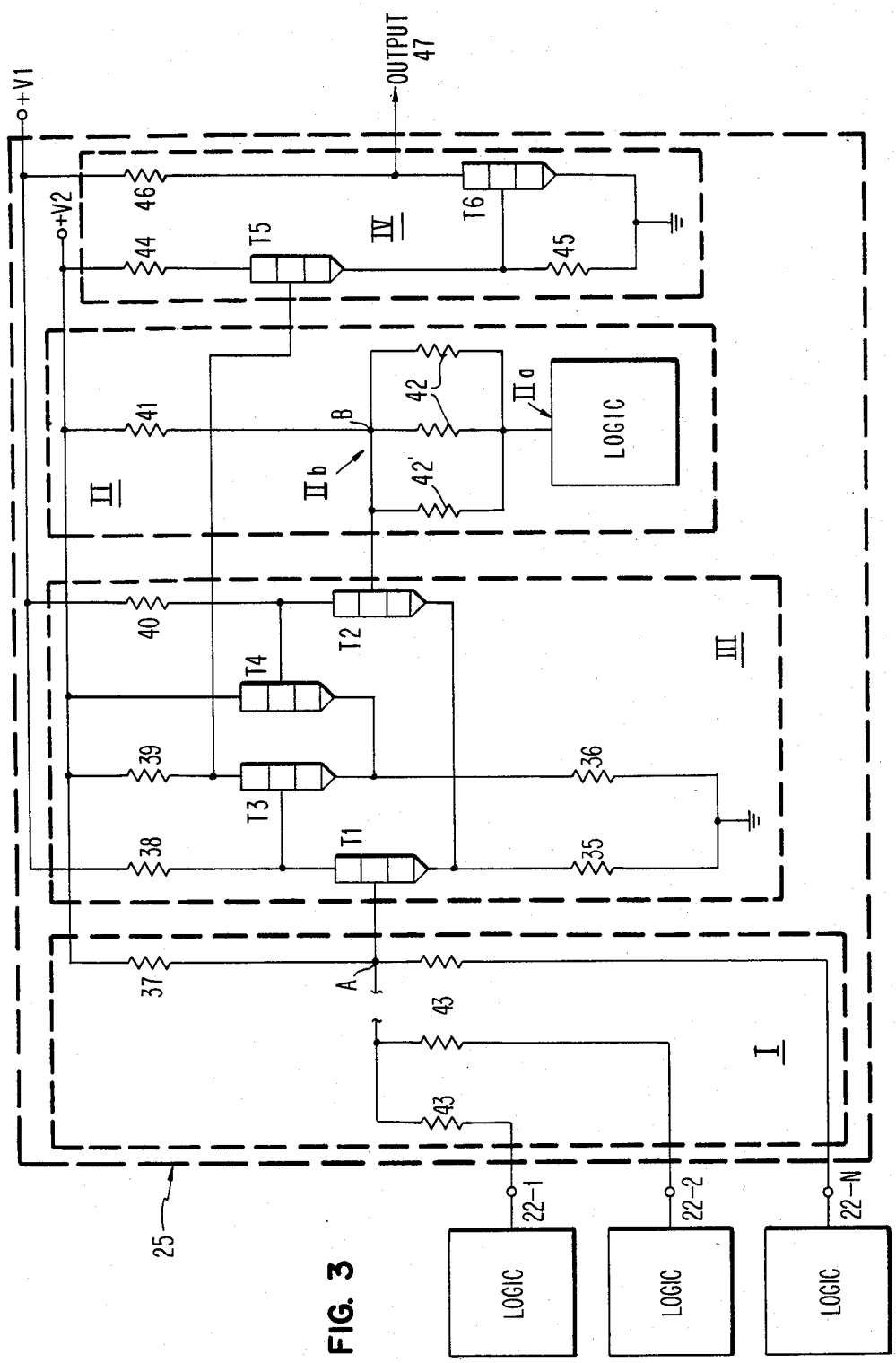
FIG. 3 is a schematic illustration of a circuit for generating the control signal in accordance with our invention.

FIG. 1 is a schematic representation of signal transmission between data processing circuit elements, for example VLSI circuit chips, known in the prior art. In the following discussion, it is assumed that when an element such as a transistor is made conductive i.e., driven into the "on" state, the element will produce a low i.e., "0" level at its output; and when the element is maintained non-conductive i.e., "off", the output will be a high i.e., "1" level. As will be appreciated by those skilled in the art, other conventions could be used depending upon the semiconductor element type employed and the voltage level supplied.

With reference to FIG. 1, a chip 1, termed for convenience the "transmit chip", for example a logic function chip, is arranged to transmit data signals to a second chip 2 for convenience termed the "receive chip", also a logic chip. For the purposes of illustration, chip 1 is shown to include a semiconductor element in the form of a bipolar NPN transistor 3 for producing the transmit chip output signal. The output signal of chip 1 appears on the transistor collector 6 and is occasioned by a drive signal which is supplied to the transistor base 7. The drive signal itself results from a logic operation previously performed. As shown, the emitter 8 of transistor 3 is grounded.

In operation, when transistor 3 is driven into conduction, i.e., turned on, the transistor signal level is low i.e., "0". When the transistor 3 is not driven, it does not conduct and its signal level is high i.e., "1". Chip 1's output signal as produced by transistor 3, is communicated to chip 2 over a transmission line shown in FIG. 1 as a coaxial cable 4 having a distributed capacitance depicted as discrete capacitor 5. A resistance R at receiver chip 2 connected to a positive voltage V acts as the receive chip input.

As seen in FIG. 1, capacitor 5 of the transmission line in effect parallels transistor 3, it being connected between collector 6 and emitter 8 (ground). Additionally, because capacitor 5 is connected to the +V voltage supply through resistor 8, capacitor 5 is charged to voltage +V when transistor 3 is non-conducting. In operation, when transistor 3 is driven into conduction, it becomes a low resistance. Capacitor 5 accordingly discharges back through transistor 3. Because transistor 3, however, has a finite internal resistance, a voltage variation at transistor 3 arises. Particularly, due to the discharge of capacitor 5, a voltage variation is caused at emitter 8. This voltage disturbance adversely affects the circuit's ground reference introducing noise into the transmitted signal and potentially adversely affects the signal's accuracy.

While for the purposes of illustration we have shown only a single transistor 3 at the output of transmit chip 1, it will be appreciated that for a conventional VLSI chip configured for parallel mode operation, many output devices would be arranged in parallel circuit relation to form the transmit chip output word. The multiple output devices each produce a bit i.e., a high ("1") or low ("0") signal level which combines with the bits of the other output devices to simultaneously form the transmit chip output word. Where many of the multiple output devices are driven into conduction simultaneously to form the output word, the tendency of the transmission line capacitive discharge to disturb the ground reference as described above, is aggravated resulting in diminished word transmission accuracy.

In accordance with our invention, these disturbances and their tendency to adversely affect the accuracy of transmitted data words are limited by limiting the number of "0"'s permitted to be transmitted simultaneously. This has the effect of limiting the low resistance paths presented to the distributed capacitance of the interconnections and the potential for noise.

To achieve this result, our improved method calls for the analysis of the transmit chip's output word to determine if the word should be modified before presentation to the interconnections. In accordance with our method the output word of the transmit chip is used to generate a control signal. Where the bits of the transmit chip output word require the number of "0"'s (low resistance paths) for transmission to be greater than or equal to the number of "1"'s (high resistance paths) a control signal is generated which calls for an inversion of the output word. Where the number of logic levels requiring a conduction state ("0"'s) for the transmit-chip output devices are less than the number of logic levels requiring a non-conduction state, ("1"'s) the control signal dictates that the output word be transmitted without modification.

Additionally, and in accordance with our method, the control signal is available at the receive chip so that when the transmit chip output word has been inverted, it may be re-inverted to present the transmit output word at the receive chip in its original form. Where the output word of the transmit chip has not been inverted, the control signal enables the word received to be processed at the receive chip without further modification. Therefore, in accordance with our invention, whatever the form of the output word, the number of "0"'s required to be transmitted over the chip interconnections will always be less than or equal to the number of "1"'s.

FIG. 2a is an illustration, in block form, of an electronic network 19 for effecting the signal transmission between integrated circuit chips in accordance with our invention. As seen in FIG. 2a, network 19 is arranged to couple transmit chip 20 having outputs 22-1 to 22-N to receive chip 21 having inputs 32-1 to 32-N. As shown, network 19 includes a first collection of circuits 23-1 to 23-N. Circuits 23-1 to 23-N are delay compensating circuits of a conventional type and are connected to receive the output signals from chip 20 and provide them individually and without phase change but delayed in time within network 19. The purpose of the time delay provided by circuits 23-1 to 23-N will be discussed in connection with the description of network 19's operation hereinafter. Network 19 additionally includes a collection of circuits 24-1 to 24-N having inputs respectively connected to the outputs of delay compensating circuits 23-1 to 23-N. Circuits 24-1 to 24-N are driver-inverter circuits for conditioning chip 20's output signals for transmission either as presented at terminals 22-1 to 22-N or inverted.

Network 19 also includes a collection of transmission lines 28-1 to 28-N and 29. Lines 28-1 to 28-N and 29 may be conventional coaxial lines and are provided to bridge the physical gap between the transmit chip and receive chip. Additionally, network 19 includes circuits 30-1 to 30-N having inputs which are arranged to receive the outputs of transmission lines 28-1 to 28-N. Circuits 30-1 to 30-N are receiver-inverter circuits having outputs individually coupled to the inputs 32-1 to 32-N of receive chip 21 for receiving the transmitted signals from lines 28-1 to 28-N and coupling them to receive chip 21 either inverted or uninverted.

To effect control of signal transmission within it. network 19 further includes a control signal generator 25 as shown in FIG. 2a. Generator 25 has multiple inputs connected to the outputs 22-1 to 22-N of transmit chip 20. Generator 25 additionally has a single output which is supplied both to driver-inverter circuits 24-1 to 24-N over line 26a and to an additional driver circuit 27 over line 26b. Driver circuit 27 is of conventional type and is provided to condition generator 25's control signal for transmission. The output of driver 27 is connected to a transmission line 29, similar to transmission lines 28-1 to 28-N, for supplying the control signal to the input of a further receive circuit 31 of the conventional type. Circuit 31 is provided with an output for supplying the control signal to receive circuits 30-1 to 30-N.

In operation, network 19 receives the output word from transmit chip 20, determines if the number of "0"s in the word is greater than or equal to the number of "1"s and thereafter generates a command for modified transmission, i.e., inversion, or unmodified transmission of data word. Additionally, network 19 makes the control signal available at the receive chip 21 to assure the transmitted data will represent the form of the data word originally appearing at the output of transmit chip 20.

More particularly, when the number of "0"s appearing at terminals 22-1 to 22-N, is greater than the number of "1"s generator 25 produces an invert control signal at its output, the invert control signal is thereafter supplied over line 26a to cause the inversion of the transmit chip output word presented at circuits 24-1 through 24-N. When the number of "1"s is greater than or equal to the number of "0"s, generator 25 produces a pass control signal which causes drivers 24-1 to 24-N to supply the transmit chip output signal without modification.

As shown in FIG. 2a, lines 28-1 through 28-N, which in preferred form are coaxial, provide the modified or unmodified transmit chip output word to the receive-inversion circuits 30-1 to 30-N. Line 29, also coaxial in preferred form, produces the control signal from driver 27 to receive circuit 31. The output of receive circuit 31 is supplied to receive circuits 30-1 to 30-N to reconstruct the transmit chip output word as it originally appeared at terminals 22-1 to 22-N.

Where generator 25's control signal requires inversion of the transmit chip output word, the control signal received at circuit 31 compells another inversion of the data word to reconstruct the output word in its original form. Thereafter, the transmitted word is delivered at the inputs 32-1 to 32-N of receive chip 21. Where the control signal produced by generator 25 permits transmission of chip 20's word without modification, the control signal supplied at receiver-inverter circuits 30-1 to 30-N permits the data word to pass to receive chip 21 unmodified.

As shown in FIG. 2a, network 19 is separate from transmit chip 20 and receive chip 21. However, as will be appreciated by those skilled in the art, in preferred form, device 19 may be distributed between transmit chip 20 and receive chip 21 as shown in FIG. 2b. In this form, delay compensating circuits 23-1 through 23-N, driver circuits 24-1 to 24-N, control signal generator 25 and driver circuit 27 may be formed with transmit chip 20. Additionally, receive circuits 30-1 to 30-N and receive circuit 31 may be formed with receive chip 21. In this arrangement, conventional coaxial transmission lines 28-1 to 28-N and 29 may be used to couple the distributed circuits of network 19.

In accordance with our invention, therefore, the number of "0"s i.e., low resistance levels coupled to the transmission lines will always be less than the number of "1"s i.e. high resistive levels coupled to the transmission line thus limiting the potential for noise caused by discharge of the transmission line distributive capacitance. The worse case occurs when there are as many "0"s as "1"s in the output word. In that case, the number of low resistive paths is equal to one-half the total number of output elements in the transmit chip.

Because the generation of the control signal by circuit 25 requires a finite time interval T, delay compensating circuits 23-1 through 23-N are provided to introduce a corresponding delay T to the signals on terminals 22-1 through 22-N. In this way, the control signal and transmit chip output signal will be properly timed when they appear at driver-inverters 24-1 to 24-N.

Figure 4:
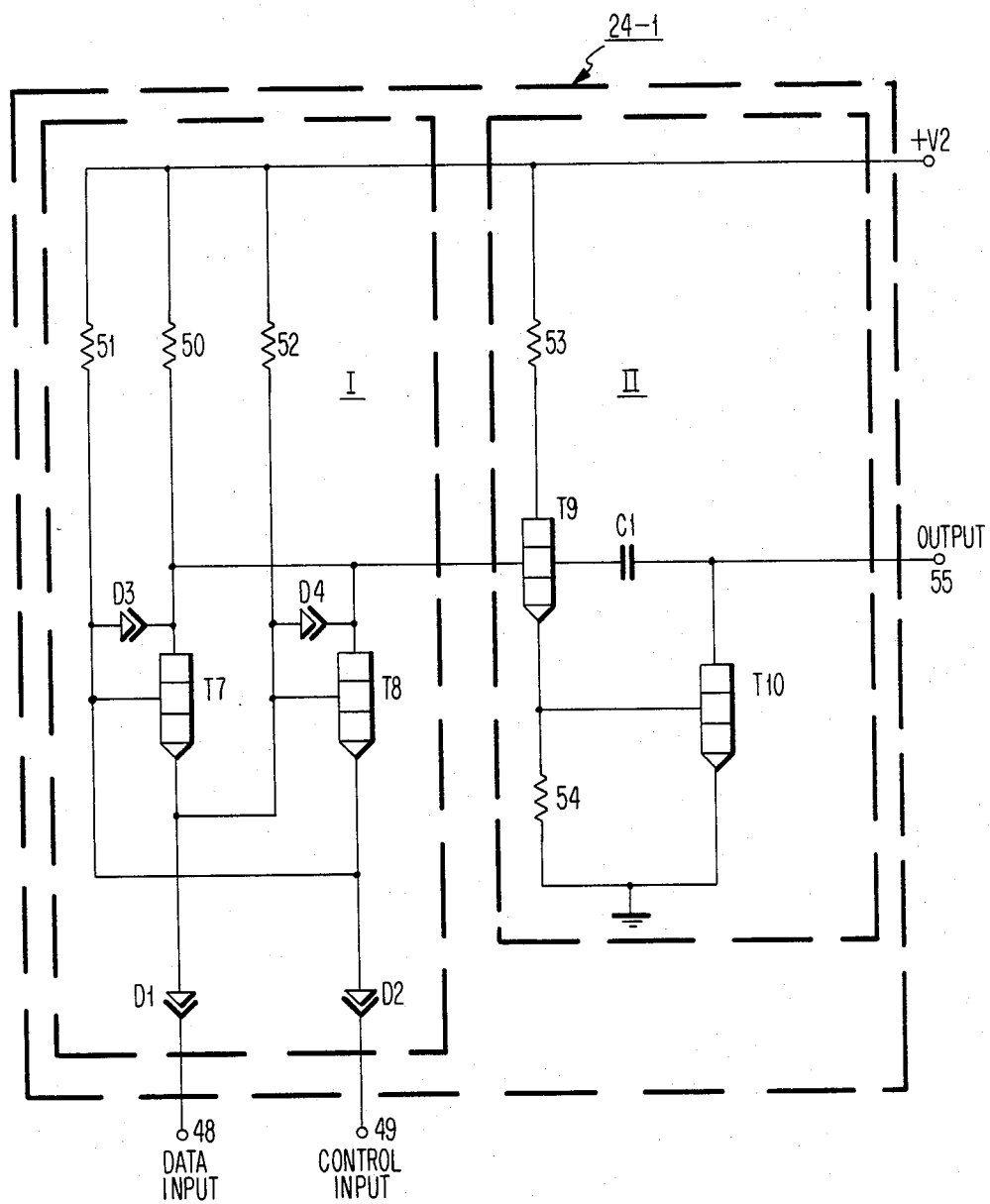
FIG. 4 is a schematic illustration of a circuit for performing the driver-invert function in accordance with our invention.
Figure 5:
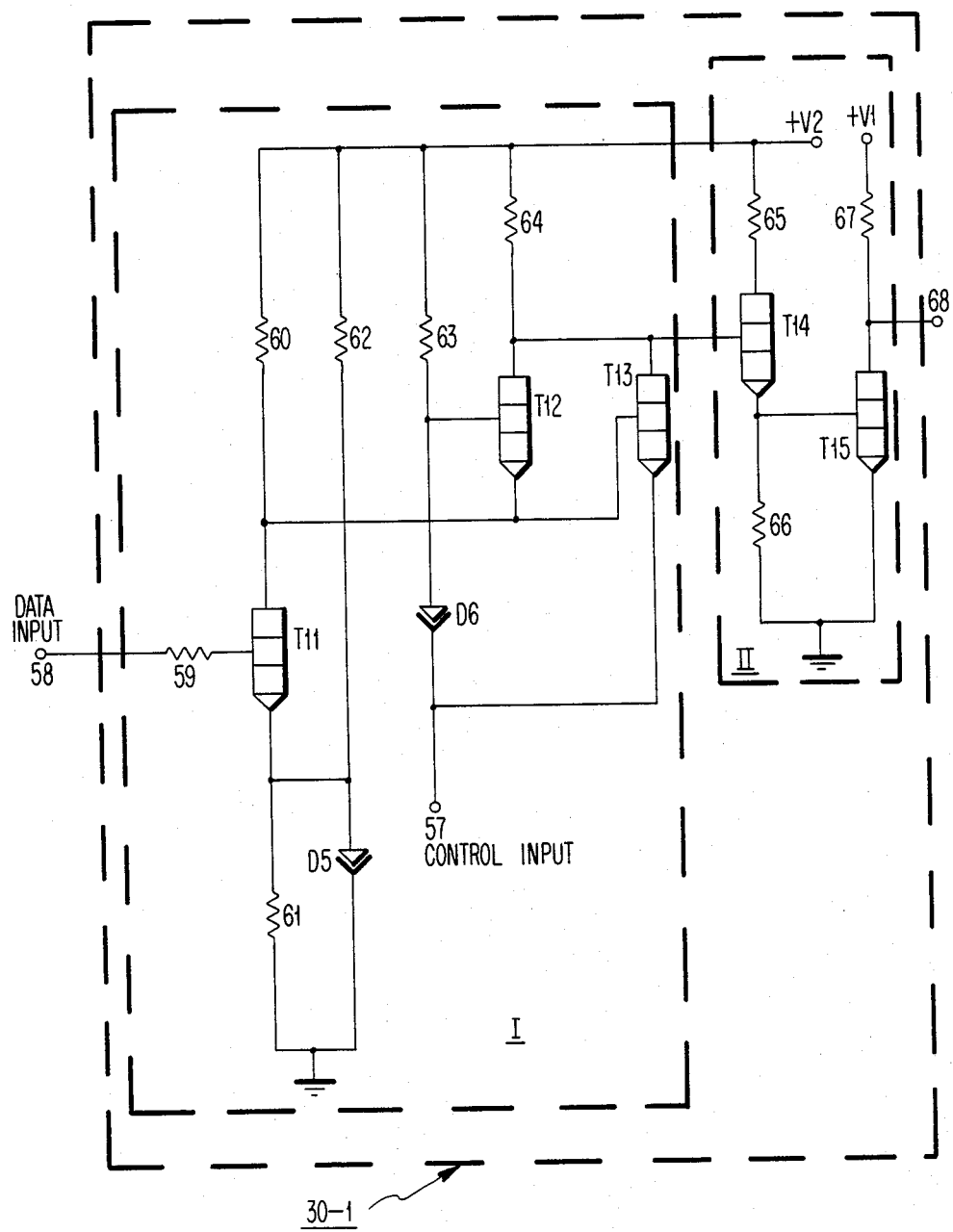
FIG. 5 is a schematic illustration of a circuit for performing the receive-invert function in accordance with our invention.

The circuits shown in FIG. 2 can be realized in many different ways. FIGS. 3, 4 and 5 show preferred forms of circuits which can be used respectively as the control signal generator 25, driver-inverters 24-1 through 24-N and receiver-inverters 30-1 through 30-N.

With reference to FIG. 3, a preferred form of generator 25 is shown to include multiple circuit sections which co-act to sum the signal levels, i.e., bits of the transmit chip output word; compare that summation to a reference signal which defines the maximum number of permissible "0"s for the output word; and generate a control signal which determines whether the output word should be transmitted inverted or uninverted. Regarding the control signal, where the number of "0"s is equal to or greater than the number of permissible "0"s, an invert control signal is generated and where the number of "0"s is less than the maximum number of permissible 0's, a noninvert control signal is generated.

More particularly, and as seen in FIG. 3, generator 25 includes an input section, designated I, including resistor 37 connected to resistors 43. Multiple resistors 43 are individually connected to output terminals 22-1 to 22-N of the transmit chip and collectively to supply $+V_2$ through resistor 37. Section I acts to establish a voltage corresponding to the state of the signals appearing at lines 22-1 to 22-N.

Additionally, generator 25 includes a low level, i.e., "0"'s reference signal section designated II for defining the maximum number of "0"'s permissible in the transmit chip output word. As shown, the "0"'s reference source includes signal generator designated IIa and a reference network IIb. Network IIb includes resistor 41 connected in series with multiple resistors 42, 42' themselves connected in parallel, the parallel combination being connected on one side to the signal generator IIa and on the other side to supply $+V_2$ through resistor 41.

Generator 25 further includes a differential amplifier section designated III, shown in FIG. 3 to include transistors T1 to T4 and resistors 35, 36, 38, 39, and 40. The inputs to differential amplifier III are at nodes A and B. Nodes A and B are respectively connected to generator 25's sections I and II and provide to the differential amplifier the voltages corresponding to the states of the transmit chip output word bits and the maximum permissible number of "0"'s respectively so that the amplifier may compare the two. As shown in section III, the emitters of transistors T1 and T2 are connected to each other and to ground through Resistor 35. Similarly, the emitters of transistors T3 and T4 are also connected to each other and to ground through resistor 36. The collectors of transistors T1 and T2 are connected through resistors 38 and 40 respectively to a first voltage supply $+V_1$, which in the preferred embodiment is 1.7 volts. The collectors of transistors T1 and T2 are also connected respectively to the bases of transistors T3 and T4. The collectors of transistors T3 and T4 are connected to a second voltage supply $+V_2$, which in the preferred embodiment is 3.4 volts. As shown in FIG. 3, the collector of transistor T3 is connected to $+V_2$ through resistor 39 while the collector of transistor T4 is connected directly to supply $+V_2$.

Differential amplifier III compares the voltages produced at nodes A and B as noted above. These voltages are presented at the bases of transistors T1 and T2. The voltage at node A arises from the division of supply voltage $+V_2$ between resistor 37 and the combination of resistors 43 individually connected to the transmit chip output terminals 22-1 to 22-N. Since resistors 43 are individually connected to terminals 22-1 to 22-N, and since the number of output terminals are equal to the number of bits in the output word, the number of resistors 43 are likewise equal to the number of bits in the transmit chip output word. The voltage at node B arises from the division of supply voltage $+V_2$ between resistors 41 and the combination of resistors 42, 42' connected to circuit section IIa. Circuit section IIa is designed to generate a level comparable to the low level, i.e., "0" generated at the output terminals 22-1 to 22-N of the transmit chip. The values and number of resistors 42, 42' vary depending on the number of "0"'s determined permissible in the transmit chip output word as will be further explained hereinafter.

An output circuit section designated IV is also included in generator 25, electrically connected to the differential amplifier section III. Output section IV includes transistors T5 and T6 and resistors 44, 45 and 46. As shown, the base of transistor T5 acts as the input of section IV and is connected to the collector of the transistor T3, the differential amplifier output. The collector of transistor T5 is connected through resistor 44 to voltage supply $+V_2$ and its emitter is connected to ground through resistor 45. Transistor T6 of section IV is connected at its base to the emitter of transistor T5, at its collector through resistor 46 to voltage supply $+V_1$ and its emitter is connected directly to ground. In this configuration, the output control signal of generator 25 is produced at transistor T6's collector on line 47.

As will be appreciated by those skilled in the art, generator 25 is capable of operating with a transmit chip having any convenient number of output bits N and is further capable of being set to generate a control signal to invert the transmit output word when a pre-determined number of output bits are "0". In the preferred embodiment, the maximum number of allowable "0"'s is set to approximately half the total number of transmit chip output bits. More exactly, where the number N of transmit chip output bits is even, the preferred permissible number of "0"'s is N/2. Where the number of output word bits is odd, the preferred permissible number of "0"'s is (N+1)/2.

Where the number of transmit chip output bits is even and the permissible number of "0"'s in the output word is N/2, the value of the resistors 37, 43 of the input section I and resistors 41, 42, 42' of the reference section IIb are selected to satisfy two requirements. First, to assure that the voltage at node B exceeds the voltage at node A when the number of "0"'s at terminals 22-1 to 22-N is equal to or greater than N/2, that is to say, $V_B > V_A$ when number "0"'s $\geq$ N/2 and second to assure the voltage at node A exceeds the voltage at node B when the number of "0"'s at terminals 22-1 to 22-N is less than N/2, that is to say, $V_B < V_A$ when number "0"'s < N/2.

More particularly, resistors 37, 41, 42, 42' and 43 are arranged in the configuration previously noted and are selected such that R37/R43 equals R41/R42. Additionally, resistors 42, 42' are arranged such that N/2−1, resistors 42 are connected in parallel with each other and in parallel with one resistor 42' equal to twice the value of an individual resistor 42. This arrangement assures that when the number of "0"'s at node A is equal to or greater than N/2, the voltage at node B will be greater than the voltage at node A.

It will be appreciated that the "0"'s and "1"'s of the transmit chip output word are complementary, that is, the number of "0"'s and "1"'s is equal to the total number of bits N. Therefore, if the number of "0"'s equals N/2, the number of "1"'s must equal N/2. Additionally, if the number of "0"'s is equal to (N/2)−1, the number of "1"'s is (N/2)+1.

The voltage at node A is determined by the number of "0"'s at terminals 22-1 to 22-N. As the number of "0"'s increases, the voltage at node A decreases. An increase in the number of "0"'s at terminals 22-1 to 22-N indicates an increase in the number of output devices of chip 20 conducting. As more output devices conduct, more of the individual resistors 43 are coupled to ground and thus coupled in parallel. Accordingly, as more resistors 43 are coupled in parallel, their total resistance decreases causing more of supply $+V_2$ to appear across resistor 37 and less at node A. Since the voltage at node A is dependent on the number of "0"'s, as additional "0"'s appear in the output word, a reference level can be set i.e., node B, having a voltage representing the maximum number of permissible "0"'s against which the voltage at node A can be compared.

As the voltage at node A falls below the voltage at node B, it is indicated that the number of "0"'s at the output word exceeds the critical number and that an invert command signal should be generated. The converse would also be true i.e., where the number of "0"'s falls below the critical value, the voltage at node A exceeds the voltage at node B.

When the number of "0"'s at terminals 22-1 to 22-N is equal to or greater than the number of "1"'s, as noted, node B has a higher voltage than node A. Consequently, and with reference to signal 3, transistor T2 is turned on and transistor T1 is turned off. Since the collector of T2 connected to the base of T4, when T2 and T1 are turned on and off respectively, transistors T4 and T3 respectively turn off and on. Further, since the collector of transistor T3 is connected to the base of transistor T5 in output section IV, when transistor T3 is turned on, transistor T5 is turned off. Since the emitter of transistor T5 is connected to the base of transistor T6 when transistor T5 is turned off, transistor T6 is also turned off and generates a high level, i.e., "1", at its collector which is the output 47 of generator 25. This high level indicates the number of "0"'s in the transmit chip output word exceed the predetermined maximum and that the word should be inverted for transmission.

Conversely, where the number of "0"'s at terminals 22-1 to 22-N is less than N/2, the voltage at node A exceeds the voltage at node B with the result that transistors T1 and T4 are on and transistors T2 and T3 are off causing transistors T5 and T6 to be on and the output of generator 25 at 47 to be low, i.e., "0". The presence of a low level at 47 indicates that the number of "0"'s in the transmit chip output word does not exceed the predetermined maximum and that the word can be transmitted uninverted.

Where the number of bits N of the output word appear at terminals 22-1 to 22-N is odd, the permissible number of "0"'s is set at (N+1)/2. Since as noted above, the reference voltage at node B is set based on the number of permissible "0"'s by adjusting the number and value of resistors 41, 42, 42', which are discreet, it is not practical to simply divide the odd number N by 2 as the result would be fractional. Therefore, in accordance with our invention, the odd number N is changed to an even number, which in the preferred form is accomplished by adding 1. It will be appreciated that N could be adjusted to be an even number by subtracting 1. Adjusting to even by subtracting 1, however, requires an inversion command when the output word has two less 0 bits than by adjusting to even by adding 1. To achieve economy, it has been found that it is preferable to permit as many zeros as possible. Therefore, it has been judged permissible to increase the number of "0"'s in the case where N is odd to (N+1)/2.

In the case where N is odd, resistors 37, 41, 42, 42' and 43 are set as previously noted. However, voltage at node B is arranged to exceed the voltage at node A when the number of "0"'s is equal to or greater than (N+1)/2 and the voltage at node A is arranged to exceed the voltage at node B when the number of 0's is less than (N+1)/2. More particularly, resistors 37, 41, 42, 42' and 43 are set such that R37/R43 equal R41/R42 with N resistors parallel at node A and (N+1)/2−1 which equals (N−1)/2 resistors 42 in parallel at node B. Again, resistor 42' is sslected to be equal to twice the value of resistor 42 and is arranged in parallel with resistors 42. In this configuration the voltage at node B is set to exceed the voltage at node A when the number of "0"'s at the output word goes from (N−1)/2 to (N+1)/2 and the voltage at node A set to exceed the voltage at node B when the number of "0"'s goes from (N+1)/2 to (N−1)/2.

The operation of generator 25 when the voltage at node B exceeds the voltage at node A and when the voltage at node A exceeds the voltage at node B is as noted in the case where the number of output word bits N is even. Particularly, 47 is high i.e., "1" requiring inversion of the transmit chip output word when the voltage at node B exceeds the voltage at node A for the number of "0"'s equal to or greater than (N+1)/2 and 47 is low i.e., "0" permitting transmission of the output word when the voltage at node A exceeds the voltage at node B for the number of "0"'s in the output word less than (N+1)/2.

A preferred form of a driver-inverter which can be used in each of stages 24-1 to 24-N of network 19 is shown in FIG. 4. For the sake of brievity, only one driver-inverter 24-1 need be described. As would be appreciated by those skilled in the art, a single driver-inverter is used per bit of output word appearing at output terminals 22-1 to 22-N. The entire output word composed of N bits would be formulated for transmission by combining a number of driver-inverters 24-1 to 24-N as shown in FIGS. 2a, b.

With reference to FIG. 4, control driver-inverter 24-1 includes an exclusive "OR" gate section designated I and an output section designated II. More particularly, exclusive "OR" gate section I is seen to include transistors T7 and T8, diodes D1–D4 and resistors 50, 51 and 52. Gate section I has a first input 48 for receiving data from companion delay-circuit 23-1 connected to output terminal 22-1 as better seen in FIGS. 2a, b.

Transistor T7 of gate section I is connected to input 48 through a diode D1 which in preferred form is of the Schottky type. Diode D1 is oriented with its anode connected to the emitter of transistor T7 and its cathode to data input 48, which, as noted, is in communication with terminal output 22-1 through delay circuit 23-1. Transistor T7 has its collector connected to voltage supply +V2 through resistor 50 and its base connected to +V2 through resistor 51. A diode D3 is connected with its anode at transistor T7's base and its cathode at transistor T7's collector to avoid transistor T7 being driven into saturation when turned on.

Gate section I of driver-inverter 24-1 has a second input 49 for receiving the control signal from generator 25. While for simplicity FIGS. 2a, b show only the last driver-inverter stage 24-N receiving the control signal over line 26a, it will be appreciated by those skilled in the art that the control signal is simultaneously supplied to all driver-inverters 24-1 to 24-N at their respective control inputs 49.

Transistor T8 of gate section I is connected to control input 49 through diode D2, which in preferred form is also of the Schottky type. As shown, Diode D2 is arranged with its anode connected to the emitter of transistor T8 and its cathode to input 49 which is in communication with output 47 of generator 25. The collector of transistor T8 is connected to the collector of transistor T7 and through resistor 50 to voltage supply +V2. The base of transistor T8 is connected to the emitter of transistor T7 at its junction with the anode of the diode D1 and further to voltage supply +V2 through resistor 52. Like transistor T7, a diode D4 is located between transistor T8's base and its collector, and is arranged such that the diode's anode is connected to transistor T8's base and its cathode to transistor T8's collector so as to prevent the transistor from saturating when it is driven into conduction.

Driver-inverter 24-1 also has an output section II which is similar to output section IV of generator 25. Particularly, output section II includes transistors T9, T10, resistors 53, 54, and a capacitor Cl. Transistor T9 of output section II has its collector connected to voltage supply +V2 through resistor 53 and its emitter connected to ground through resistor 54. The base of transistor T9, which is the input to section II, is connected to the collectors of transistors T7 and T8 which are the outputs of gate section II of driver-inverter 24-1. Output section II also has a transistor T10 having its collector connected to a voltage supply +V2 and an emitter tied directly to ground. The collector of T10 is connected to voltage supply +V through the transmission line and a resistor R located at the receive chip as better seen in FIG. 1. The base of transistor T10 is connected to the emitter of transistor T9 at the junction of the emitter of transistor T9 and resistor 54. The output of driver-inverter 24-1 appears at point 55, the collector of transistor T10. Point 55 would be connected to transmission line 28-1 as better seen in FIGS. 2a, b for transmission of the data bit to receive chip 21.

The operation of driver-inverter 24-1 is as follows. Where generator 25's output signal mandates the output word at terminals 22-1 to 22-N be transmitted unmodified, i.e., uninverted, the signal level appearing at generator 25's output 27 and accordingly driver 24's input 49, is "0". Further, where the bit appearing at output terminals 22-1 is "0", the input at data input 48 of driver-inverter 24-1 is also "0". With input 48, and input 49 at "0", diodes D1 and D2 are conducting causing transistors T7 and T8 to be off. Accordingly, the collectors of transistors T7 and T8 are high i.e., "1" and transistor T9 is on resulting in transistor T10 being on. The consequence of this conduct pattern is that output 55 is low i.e., "0". Thus, where the output of 22-1 is at "0" and generator 25's output is at "0", the output 55 of driver-inverter 24-1 is also at "0".

Where the driver-inverter data input 48 is high i.e., "1" indicating a "1" at terminal 22-1 and driver-inverter control input 49 is "0" indicating generator 25 continues to have a "0" output mandating that the output word be transmitted without modification, diode D1 is non-conducting and diode D2 is conducting this causes transistor T8 to be turned on. When transistor T8 is turned on, its collector goes low i.e., "0" causing transistor T9 to turn off and with it, transistor T10. The result is that where 22-1 is at "1" and generator 25's output is at "0", the output 55 of driver-inverter 24-1 is "1".

Continuing, where the signal at the driver-inverter data input 48 is "0" as where the bit at terminal 22-1 is "0" and the signal at the driver-inverter control input 49 is "1", as where generator 25's output 47 is "1" mandating an inversion of the transmit chip output word, diode D1 is conducting and diode D2 is non-conducting. Accordingly, transistor T7 is on and its collector is low, i.e., "0" rendering transistors T9 and T10 non-conducting. The result is output 55 of driver-inverter 24-1 is high, i.e., "1". Thus, with input 48 at "0" and input 49 is "1", output 55 of driver-inverter 24-1 is "1".

Finally, when the signal at driver-inverter data input 48 is high, i.e., "1", as where the bit at terminal 22-1 is "1" and the signal at driver-inverter control input 49 continues to be "1" indicating generator 25 continues to mandate an inversion of the output word, diodes D1 and D2 are non-conducting and transistors T7 and T8 are off causing transistors T9 and T10 to be on with the result that a low state, i.e., "0" is generated at output 55. Thus with data input 48 at "1" and control input 49 at "1", the output 55 of the driver-inverter 24-1 is "0".

A preferred form of a receiver-inverter circuit which can be used in stages 30-1 to 30-N of network 19 is shown in FIG. 5. For brevity, only one circuit 30-1 will be described. It will again be appreciated as in the case of driver-inverter 24-1 that receiver-inverter 30-1 is intended to receive one bit of the transmit chip output word to communicate it to receive chip 21. The full word is constructed at receiver chip 21 by combining all the receiver-inverter outputs to supply the N bits of the originally formulated output word.

As shown in FIG. 5, receiver-inverter 30-1 includes a first gate section designated I and an output section designated II. Section I of receiver-inverter 30-1 includes transistors T11, T12, T13, diodes D5, D6 and resistors R59 to 64. Gate section I is provided with two inputs, a first 58 for receiving a data bit of the output transmit word from the transmission line e.g., 28-1 and a second input 57 for receiving the control signal originally produced by generator 25 and made available at receive circuit 30-1 by driver circuit 27, transmission line 29 and inverter 31 associated with receiver-inverter 30-1 to 30-N.

As in the case of the driver-inverter 24-1, while FIGS. 2a, b show only receiver-inverter 30-N receiving the signal from circuit 31, it will be appreciated that the output of circuit 31 is made available at all of the receiver-inverters 30-1 to 30-N.

As shown in FIG. 5, gate section I includes transistor T11 having its emitter connected to ground through resistor 61 and a collector connected to power supply +V2 through resistor 60. Additionally, data input 58 is connected to the base of transistor T11 through resistor 59. Still further, a resistor 62 is connected between transistor T11's emitter and voltage supply +V2. A diode D5 is connected between the junction of transistors T11's emitter, resistors 61 and 62 and ground. The resistors 60, 61, 62 and diode D5 are provided to supply the bias for transistor T11.

Continuing with reference to FIG. 5, the control input 57 of gate section I is connected to transistor T12 through a diode D6. Diode D6 has its anode connected to the base of transistor T12 and a cathode connected to control input 57. The base of transistor T12 is additionally connected to power supply +V2 through resistor 63. Further, the collector of transistor T12 is connected to supply +V2 through resistor 64 while the emitter of transistor T12 is connected to the collector of transistor T11. Gate section I has a further transistor T13 having a base connected to the emitter of transistor T12 and the collector of transistor T11. Additionally, the collector of transistor T13 is connected to the collector of transistor T12 and through resistor 64 to the supply +V2. The emitter of transistor T13 is connected to the cathode of diode D6 at input 57. As further shown in FIG. 5, the output section II of receiver-inverter 30-1 includes transistor T14, T15 and resistors 65 to 67. More particularly, the base of transistor T14 acts as the input to section II and is connected to the collectors of transistors T12 and T13 and through resistor 64 to supply +V2. Additionally, the collector of T14 is connected to supply +V2 through resistor 65 and its emitter connected to ground through resistor 66. Finally, output section II includes transistor T15 having a base connected to the emitter of transistor T14 at the junction of transistor T14's emitter and resistor 66. The emitter of transistor T15 is connected directly to ground and its collector is connected to supply +V1 through resistor 67. The collector of transistor T15 is the output 68 of receiver-inverter 30-1 and, as shown in FIGS. 2a, b would be connected to the inputs of receive chip 21 at 32-1.

As explained previously, receive chip 30-1 is provided in network 19 so that the original form of the output data word may be established at the receive chip. That is to say, where the output data word has been inverted in accordance with this invention to maintain the transmission of "0"'s below a predetermined number, receive circuit 30-1 enables the data bits to be inverted again to establish them in their original form. To accomplish this, the control signal of generator 25 is made available at receive circuit 30 through receiver-inverter circuit 31. However, since the control signal is inverted by circuit 31, a low level, i.e., "0" appears at the output of circuit 31 will indicate a command to invert the data word at receiver-inverter circuit 30-1 while a high level, i.e., "1" at the output of circuit 31 will indicate a command to communicate the data word bit through receiver 30-1 without change.

In operation, when a low level, i.e., "0" is presented at control input 57, the signal represents a command by circuit 31 and generator 25 for inversion. Accordingly, a "0" at input 57 mandates that the bit received at 30-1 be inverted in order that the bit as originally appearing at terminal 22-1 be re-established. Conversely, when the signal at control input 57 is high, i.e., "1", the signal mandates that the bit received at 30-1 be passed without modification because the original form of the output word bit has been transmitted without modification.

The operation of circuit 30-1 may be described as follows. With a "0" at control input 57 and a "0" at data input 58, transistor T11 is caused to be off, diode D6 is caused to be conducting, transistor T12 is off and transistor T13 is on. Accordingly, transistors T14 and T15 are off resulting in a high level, i.e., "1" at point 68. Thus, with control input 57 at "0" and data input 58 at "0" the output of receiver 30-1 is "1".

Continuing, if the control input 57 continues at "0" but the data input 58 becomes "1", transistor T11 turns on, diode D6 continues to be conducting and transistor T12 remains off but transistor T13 turns off. Accordingly, transistors T14 and T15 become conductive and the output at 68 is driven low, i.e., "0". Thus, with control input 57 at "0", data input at "1", the output of receiver 30-1 is "0".

Still further, where the control input goes high, i.e., "1" indicating a command to pass the receive bit through to receive chip 21 without modification, i.e., not inverted, operation is as follows. Where 57 is "1" and data input 58 is "0", transistor T11 is off, diode D6 is non-conducting, transistor T12 is off and transistor T13 is off. Accordingly, transistor T14 and T15 are conducting giving rise to a low level, i.e. "0" at output 68. Thus, where control input 57 is "1" and data input 58 is "0", the output of receiver-inverter 30-1 is "0".

Finally, where the control input continues high, i.e., "1", indicating the receive data should not be modified, and data input 58 goes high, i.e., "1", transistor T11 turns on, diode D6 remains non-conducting, transistor T12 turns on and transistor T13 remains off. Accordingly, transistors T14 and T15 turn off and output 68 goes high, i.e., to "1". Thus with control input 57 at "1" and data input 58 at "1", the output of receive circuit 30-1 is "1".

Circuit 25 can assure the shape of a logic circuit based on the known logic majority gate principle. Such circuits can be realized from programmable logic arrays (PLA).

Since the representation of such circuits is almost impracticable, there will be given the theoretical information which will enable the man skilled in the art to realize circuit 25 according to different assumptions. Indeed, the realization of such a logic circuit implies solving an optimization problem with several parameters which are varying in opposite directions.

Before starting with the description, there will be given some necessary definitions.

Whether the connections from an integrated circuit to another integrated circuit are commands (or controls) or data, the latter are always more or less grouped into ordered bundles, i.e., into BIT SEQUENCES or WORDS. N will be the generic number of bits of a bit sequence to be conveyed from one integrated circuit to another one.

There will be considered, here, the case when the logic circuit is implemented in a negative logic, i.e.:

$\rightarrow$ = ACTIVE line
$\rightarrow 1$ = INACTIVE line

If all the output terminals (also referred to as output pins) of an integrated circuit are grouped into N-Bit bundles, and if, according to the present invention, such a logic circuit 25 is implemented per each N-bit bundle as in FIG. 2, then the PIN INCREASE RATIO, $\Delta$pin, defined as the number of additional output pins, 29, due to the use of the present invention, divided by the number of data output pins 28-1 thru 28-N, or 22-1 thru 22-N, if the invention were not use, is:

$\rightarrow \Delta\text{pin} = 1 \div N.$

TR denotes the inactive ratio of a type of words, i.e., the ratio of its inactive bits. More specifically, two N-bit binary words will be said to be of the same type when, and only when, they are of the same ratio TR. For instance, there will be considered all the sequences of N=5 bits out of which M=3 are inactive.

$\rightarrow$ 0 0 1 1 1,
$\rightarrow$ 0 1 0 1 1,
$\rightarrow$ 0 1 1 0 1,
$\rightarrow$ 0 1 1 1 0,
$\rightarrow$ 1 0 0 1 1,
$\rightarrow$ 1 0 1 0 1,
$\rightarrow$ 1 0 1 1 0,
$\rightarrow$ 1 1 0 0 1,
$\rightarrow$ 1 1 0 1 0,
$\rightarrow$ 1 1 1 0 0, When (M!N) (read <<M out of N>>) is meant for the number of the combinations without repetitions, or order M, achievable from N elements, the number of the preceding binary words is (M!N)=(N-M)!N=3!5=2!5=10 and these words are all of the same type, namely:

$\rightarrow TR = 3 \div 5 = 60\%$

The logic implementation of circuit 25 will be achieved by means of a PLA array out of which the number MT of MIN-terms (i.e., the product terms) will be considered equal to the number of the logic circuits. Then, the CIRCUIT COUNT RATIO, designated by TC, of an N-bit circuit 25 will be referred to as the ratio:

→ $TC = MT \div (N+1)$ of the number of the additional circuits (required by the device 25 itself) and the total number of the final connections (i.e. the N bits in the sequences plus the control bit 26 generated by this circuit 25 and controlling the invert or transmit operation of the sequence to be conveyed).

Parameter TR itself, indeed, leads to three new distinct parameters which are as follows:

| | |
|---|---|
| → ITR = TR | of the initial word, i.e., without taking either device 25 or the additional control bit 26, into account. |
| → JTR = TR | of the final word i.e. taking both device 25 and circuits 24-1 through 24-N, into account and not taking the additional connection 29, into account; (as a consequence, JTR is directly comparable with ITR, materializing therefrom the gains obtained on this parameter with using device 25). |
| → KTR = | the global TR of the total final sequence i.e., taking both device 25 and circuits 24-1 through 24-N and the additional control connection 29, into account (KTR is the actual TR obtained in the end). |

Each of the preceding three parameters, that can be referred to as XTR (with W=I, J or K) as a matter of fact, is defined for each type of initial words, and therefore, for each initial word, itself. It results therefrom that six new parameters can be introduced, which will be used as follows:

| | |
|---|---|
| → mXTR = | minimum of XTR for all the possible initial binary words (with X = I, J or K) |
| → μXTR = | statistical mean value of XTR for all the possible initial binary words (X = I, J or K). |

With all these essential definitions, the problem to solve is to find out an optimum that corresponds simultaneously to:

| | |
|---|---|
| → | a minimization of Δpin; (in the few years coming, VLSI chips with 200–400 inputs/outputs can be expected, authorizing no more than 20-50 outputs "lost" for the logic implementing the device according to this invention: namely, a reasonable limit of Δpin ≅ 10–15%), |
| → | a minimization of TC; (in the few years coming, chips with 15 000 or 30 000 circuits for 200–400 inputs/outputs, can be expected authorizing, for the completion of circuits 25, hardly more than 2000 circuits for 400 pins, which leads to an approximate limit of TC ≅ 5 circuits/pin), |
| → | μITR < μJTR: a maximization of μJTR, a parameter directly comparable with μITR ; but, as a matter of fact, a maximization of μKTR, the only actual parameter that is obtained in the end. The limits to be set for the preceding two parameters (μJTR and μKTPR result from the following property. |
| SI(N) | will be referred to as the mathematical set of all the possible INITIAL N-bit binary words, each of which can appear on the N data lines 22-1 thru 22-N ; |
| SJ(N) | will be referred to as the set of all the possible RESTRICTED final binary words, each of which can appear on the N data lines 28-1 thru 28-N; |
| SK(N) | will be referred to as the set of all the possible TOTAL Final (N+1)-bit words, each of which can appear on the N data lines 28-1 thru 28-N plus on the control line 29, and which eventually result from using the present invention. |

With the previous terminology, whatever the positive integer N may be, the properties, illustrated in table I, are always valid.

TABLE I

| | |
|---|---|
| mITR(N) = | 0, and 50% of the words of SI(N) have a ITR ≧ 50% with an average of |
| μITR(N) = | 50% |

This means that the minimum of the TR's of all the SI(N) words is zero, which is very much unfavourable in addition, only half of these words have a TR attaining or exceeding 50%; finally the average TR of all those words does not itself exceed 50%. Due to these considerations and as a first objective, the following conditions can be set forth:

mKTR(N)>mJTR(N)>0, more than 50% of SJ(N) words have their JTR≧50% more than 50% of SK(N) words have their KTR≧50% with:

μKTR(N)>μJTR(N)>50%.

Case N=4 will completely be considered by way of an example in order to illustrate all the mechanisms of the reasoning; then, the case where the number is odd, N=5 in the chosen example, will be considered more rapidly; then, the general conclusions drawn from these two examples will be applied to the two cases that are encountered most of the time: N=8 and N=9, with a possible extension by analogy.

Complete consideration of case N=4: assume P be the total number of all the initial 4-bit binary words, i.e., the cardinal number of SI(N); there is obtained:

| | |
|---|---|
| P = 2*N = 2*4 = 16 | (*: the exponentiation operator i.e. 2 to the Nth power) | distributed into N+1=4+1=5 types from 0 to N:

TABLE II

| | | |
|---|---|---|
| (4!4) = | 1 of type 4: | 1 1 1 1 ; |
| (3!4) = | 4 of type 3: | 0 1 1 1 , |
| | | 1 0 1 1 , |
| | | 1 1 0 1 , |
| | | 1 1 1 0 ; |
| (2!4) = | 6 of type 2: | 0 0 1 1 , |
| | | 0 1 0 1 , |
| | | 0 1 1 0 , |
| | | 1 0 0 1 , |
| | | 1 0 1 0 , |
| | | 1 1 0 0 ; |
| (1!4) = | 4 of type 1: | 0 0 0 1 , |
| | | 0 0 1 0 , |
| | | 0 1 0 0 , |
| | | 1 0 0 0 ; |
| (0!4) = | 1 of type 0: | 0 0 0 0 |
| Total: | 16 = 2*4 = 2*N | |

The TYPES of words themselves can be classified into two categories:

category of types of words with TR≧50 category of types of words with TR<50

In the particular case, here, where N is EVEN, three categories can even be envisaged:

TR>50%,

TR=50%,
TR<50%.

EXAMPLES

TR (1 1 0 1)=TR (3, 4)=(3÷4)=75%
TR (1 0 1 0)=TR (2, 4)=(2÷4)=50%
TR (1 0 1 0)=TR (0, 4)=(0÷4)=0%

It results immediately therefrom the following three points:
 the solution of the problem to be solved is simple: invert all the bits in only those initial words that have too low a TR and then, because of this inversion, obtain a higher TR (indeed, inverting a word leads to: TR'=1-TR).
1. When inverting all the bits in any word of category TR>50%, there is obtained a word of category TR<50%, such a change must be proscribed since it adversely affects the final purpose.
2. Likewise, when changing any word of category TR=50%, there is obtained another word in the SAME category; such a change must be proscribed since it is useless for the final purpose.
3. Finally, when completing the same operation upon any word of category TR<50%, there is obtained a word of category TR>50%; this kind of change must be systematically retained since, by itself, it contributes to the final purpose which consists in increasing TR in the most possible way.

Logic aspect of the problem: when following the change process such as defined previously, all the words in table II can be rewritten, each of them being followed with the so-called PASS/INVERT control bit 26. This control bit satisfies the following logic convention:
 1=INACTIVE→PASS
 0=ACTIVE→INVERT The result shown in table III is actually the truth table of circuit 25:

TABLE III

```
1 1 1 1 : 1
0 1 1 1 : 1
1 0 1 1 : 1
1 1 0 1 : 1
1 1 1 0 : 1
0 0 1 1 : 1
0 1 0 1 : 1
0 1 1 0 : 1
1 0 0 1 : 1
1 0 1 0 : 1
1 1 0 0 : 1
0 0 0 1 : 0
0 0 1 0 : 0
0 1 0 0 : 0
1 0 0 0 : 0
0 0 0 0 : 0
```

So that this table is more easily exploitable, it can be rewritten into a Karnaugh diagram, as shown in table IV, where all the cells left blank are supposed to be 1, i.e. INACTIVE.

TABLE IV (Karnaugh diagram with variables A, B, C, D)

When designating by A, B, C, D the N=4 terminals 22-1 through 22-N, the logical theory of the prime implicants yields the following pass/invert function IT:

$$\overline{IT} = \overline{A}\,\overline{B}\,(\overline{C} + \overline{D}) + \overline{A}\,(\overline{C}\,\overline{D}) + 0 + \overline{B}\,(\overline{C}\,\overline{D}),$$

$$= \overline{A}\,\overline{B}\,\overline{C} + \overline{A}\,\overline{B}\,\overline{D} + \overline{A}\,\overline{C}\,\overline{D} + \overline{B}\,\overline{C}\,\overline{D}.$$

The preceding writing satisfies the line-to-line order of the prime implicants of the diagram illustrated in table IV. It is a logic sum of $(3!4) = 4$ products which are precisely those which are indicative of the words to be inverted:

$$\overline{A}\,\overline{B}\,\overline{C}\,\overline{D}$$
$\overline{A}\,\overline{B}\,\overline{C} \rightarrow 0\,0\,0\,1,$ ($\overline{D}$ is lacking)
$\overline{A}\,\overline{B}\,\overline{D} \rightarrow 0\,0\,1\,0,$ ($\overline{C}$ is lacking)
$\overline{A}\,\overline{C}\,\overline{D} \rightarrow 0\,1\,0\,0,$ ($\overline{B}$ is lacking)
$\overline{B}\,\overline{C}\,\overline{D} \rightarrow 1\,0\,0\,0.$ ($\overline{A}$ is lacking)

N.B.: from the logic optimization point of view, it is not necessary to consider sequence 0 0 0 0 because the corresponding product $\overline{A}\,\overline{B}\,\overline{C}\,\overline{D}$ has already been processed in the preceeding product sum, as indicated by the circle in table IV:

$$\overline{A}\,\overline{B}\,\overline{C} = \overline{A}\,\overline{B}\,\overline{C}\,D + \overline{A}\,\overline{B}\,\overline{C}\,\overline{D}$$

Assimilating the number of the involved circuits to the number of the product terms, leads to the following circuit ratio:

$$TC = (3!4) = 4 \text{ for 5 final outputs,}$$

$$= 4 \div 5,$$

$$= 0.8 \text{ circuit/pin, } <5 \text{ which is therefore, satisfactory.}$$

When applying this formula to any even number $N = 2 \times M$, there is obtained:

$$TC = (1+N \div 2)!N \text{ for } N+1 \text{ final outputs,}$$

$$= ((1+N \div 2)!N) \div (N+1).$$

The pin increase ratio, $\Delta\text{pin}$, is prohibitive for $N=4$:

$$\Delta\text{pin} = 1 \div 4 = 25\%, > 10\text{-}15\%.$$

After taking the pass/invert operation into account, table III can be rewritten as table VI and the following three statements hold:
1. The 16(i.e. 2×N) words, on the left, represent all the values which can appear on bundles 22-1 thru 22-N (with N=4);
2. The central column represents the value of strand 26, associated by circuit 25 to each and every data word, applicable to bundle 22-1 thru 22-N (N=4):
3. The 16 words, on the right, represent the value appearing on output bundle 28-1 thru 28-N (N=4), as a result of processing each and every data word, applicable to bundle 22-1 thru 22-N, through exclusive-OR circuits 24-1 thru 24-N.

The properties, illustrated in table V, are directly derived from these considerations.

TABLE V mJTR = 50%, and 100% of the words of SJ(N) have a
JTR ≧ 50% with an average of
μJTR = 69% to be compared to the general result of table I.

TABLE VI

```
1111,11111
0111,10111
1011,11011
1101,11101
1110,11110
0011,10011
0101,10101
0110,10110
1001,11001
1010,11010
1100,11100
0001,01110
0010,01101
0100,01011
1000,00111
0000,01111
```

Now, if we mentally associate strand 29 to bundle '28-1 thru 28-N' by the means of concatenation, in other words if we consider strand 29 as a new strand 28-0, then we obtain, as a final result, the values of all the possible 5-bit words yielded on bundle '28-0, 28-1 thru 28-N' (N=4) by our pass/invert process and from which table VII is derived.

In more details, we see on table VI that there is not any 5-bit word applicable to bundle '28-0, 28-1 thru 28 N' (N=4) with less than 3 bits to logic value '1'. As an immediate consequence, the minimum TR obtained is obviously:

$$mKTR = 3 \div 5,$$

$$= 60\%.$$

Furthermore, ALL of these 5-bit words, i.e. 100% of them, have their TR nothing but greater than or equal to this minimum of 60%.

As to the average TR of these 5-bit words, i.e. the so defined μKTR, we have, by applying the mathematical definition of a statistical mean value:

$$\mu KTR = (1\times 5 \div 5) + (4\times 4 \div 5) + (10\times 3 \div 5) + (1\times 4 \div 5) \div 16$$

$$= (5+16+30+4) \div (5\times 16),$$

$$= 55 \div (5\times 16),$$

$$= 11 \div 16,$$

$$= 0.6875,$$

$$\simeq 69\%.$$

The previous considerations entirely explain table VII which must be compared to table I to fully appreciate the improvements due to the process and device herein disclosed.

TABLE VII mKTR = 60% and 100% of the words of SK(N) have a
KTR ≧ 60% > 50% with an average of
μKTR = 69%

The statistical results and the number of the circuits are excellent but the pin increase ratio, Δpin, which is comparatively high, prevents this case from being systematically used and limits its use to two or three four-lead bundles.

Processing of case N=5: Table VIII is similar to the combination of tables II, III and VI; in addition, only one word per type will be written.

TABLE VIII

| (5!5) = | 1 of type 5: | 11111,111111 |
|---|---|---|
| (4!5) = | 5 of type 4: | 01111,101111 |
| (3!5) = | 10 of type 3: | 00111,100111 |
| (2!5) = | 10 of type 2: | 00011,100011 |
| (1!5) = | 5 of type 1: | 00001,011110 |
| (0!5) = | 1 of type 0: | 00000,011111 |
| Total: 32 = 2*5 = 2*N. | | |

The only new point is worthwhile studying with respect to case N=4, is the oddness of the number of the outputs. Thus, it will be decided not to invert the 10 sequences of type 2, namely 00011 though the result would be an increased JTR (3÷5=60% instead of 2÷5=40%); if not, there would be obtained the same type of final sequence (when taking lead 29, into account):

1 1 1 0 0 0 instead of 0 0 0 1 1 1.

This remark makes it possible to reduce the number of the circuits from (2!5)=10 to (1!5)=5 for a same global result really obtained (KTR and not JTR).

TABLE IX

Δpin = (1÷5) = 20%
TC = (1!5) ÷ (5+1) = 0.8 circuit/pin,
mJTR = 40% and 73% of the words of SJ(N) have a
JTR ≧ 60% > 50% with an average of
μJTR = 63%;
mKTR = 50% and 100% of the words of SK(N) have a
KTR ≧ 50% with an average of
μKTR = 66%

Here also, the parameter Δpin, which is too high, limits the use of this case to only a few isolated 5-bit bundles.

When ABCDE are the signal on wires 22-1 through 22-N, the invert/pass control signal will be obtained by personalizing the circuit PLA so that it has the following function:

$$IT = \overline{A}\,\overline{B}\,\overline{C}\,\overline{D} + \overline{A}\,\overline{B}\,\overline{C}\,\overline{E} + \overline{A}\,\overline{B}\,\overline{D}\,\overline{E} + \overline{A}\,\overline{C}\,\overline{D}\,\overline{E} + \overline{B}\,\overline{C}\,\overline{D}\,\overline{E}.$$

Normal-processing of cases N=8 or 9: it will be observed that two cases seem to meet the desired optimizaton. The two tables X and XI summarize the study of case N=8. For that case, the minimum value of all the KTR's i.e. mKTR, is maximized, while the two parameters, Δpin and TC stay within tolerable limits.

The two tables XII and XIII summarize the study of case N=9; they show immediately that the circuit count ratio, TC, is too high. Consequently, case N=9 requires an additional trade-off step: decreasing the circuit count of block 25 but correlatively decreasing also the minimum of the KTR's; the corresponding study is summarized in table XIV and XV. Comparing tables XIII and XV shows very clearly that practically no degradation of μKTR has been made, meaning therefrom that, statistically, the TR parameters have not been too much degraded, whise considerably reducing the circuit count ratio, yielding it into tolerable limits.

TABLE X

| CASE: N = 8 |
| --- |
| A B C D E F G H |
| (8!8) = | 1: | 1 1 1 1 1 1 1 1, 1 1 1 1 1 1 1 1 |
| (7!8) = | 8: | 0 1 1 1 1 1 1 1, 1 0 1 1 1 1 1 1 |
| (6!8) = | 28: | 0 0 1 1 1 1 1 1, 1 0 0 1 1 1 1 1 |
| (5!8) = | 56: | 0 0 0 1 1 1 1 1, 1 0 0 0 1 1 1 1 |
| (4!8) = | 70: | 0 0 0 0 1 1 1 1, 1 0 0 0 0 1 1 1 |
| (3!8) = | 56: | 0 0 0 0 0 1 1 1, 0 1 1 1 1 0 0 0 |
| (2!8) = | 28: | 0 0 0 0 0 0 1 1, 0 1 1 1 1 1 0 0 |
| (1!8) = | 8: | 0 0 0 0 0 0 0 1, 0 1 1 1 1 1 1 0 |
| (0!8) = | 1: | 0 0 0 0 0 0 0 0, 0 1 1 1 1 1 1 1 |
| Total: 256 = 2*8 = 2* N. | | |

Circuit PLA is personalized according to formula:

$$\overline{IT} = \overline{A}\,\overline{B}\,\overline{C}\,\overline{D}\,\overline{E} + \overline{A}\,\overline{B}\,\overline{C}\,\overline{D}\,\overline{F} + \ldots + \overline{D}\,\overline{E}\,\overline{F}\,\overline{G}\,\overline{H}$$

a sum of 56 logic products (56=5!8).

TABLE XI

| | |
| --- | --- |
| Δpin = | (1÷8) ≅ 13%, |
| TC = | (3!8) ÷ (8+1) ≅ 6 circuit/pin, |
| mJTR = | 50% and, 100% of the words of SJ(N) have a |
| JTR ≧ | with an average of |
| μJTR = | 64%; |
| mKTR = | 56% and, 100% of the words of SK(N) have a |
| KTR ≧ | 56% > 50% with an average of |
| μKTR = | 64%. |

TABLE XII

| CASE N = 9 |
| --- |
| A B C D E F G H I |
| (9!9) = | 1: | 1 1 1 1 1 1 1 1 1, 1 1 1 1 1 1 1 1 1 |
| (8!9) = | 9: | 0 1 1 1 1 1 1 1 1, 1 0 1 1 1 1 1 1 1 |
| (7!9) = | 36: | 0 0 1 1 1 1 1 1 1, 1 0 0 1 1 1 1 1 1 |
| (6!9) = | 84: | 0 0 0 1 1 1 1 1 1, 1 0 0 0 1 1 1 1 1 |
| (5!9) = | 126: | 0 0 0 0 1 1 1 1 1, 1 0 0 0 0 1 1 1 1 |
| (4!9) = | 126: | 0 0 0 0 0 1 1 1 1, 1 0 0 0 0 0 1 1 1 |
| (3!9) = | 84: | 0 0 0 0 0 0 1 1 1, 0 1 1 1 1 1 0 0 0 |
| (2!9) = | 36: | 0 0 0 0 0 0 0 1 1, 0 1 1 1 1 1 1 0 0 |
| (1!9) = | 9: | 0 0 0 0 0 0 0 0 1, 0 1 1 1 1 1 1 1 0 |
| (0!9) = | 1: | 0 0 0 0 0 0 0 0 0, 0 1 1 1 1 1 1 1 1 |
| Total : 512 = 2*9 = 2*N; | | |

Circuit PLA is personalized according to formula:

$$\overline{IT} = \overline{A}\,\overline{B}\,\overline{C}\,\overline{D}\,\overline{E}\,\overline{F} + \overline{A}\,\overline{B}\,\overline{C}\,\overline{D}\,\overline{E}\,\overline{G} + \ldots + \overline{D}\,\overline{E}\,\overline{F}\,\overline{G}\,\overline{H}\,\overline{I}$$

a sum of the 84 logic products (84=6!9).

TABLE XIII

| | |
| --- | --- |
| Δpin = | (1÷9) ≅ 11%, |
| TC = | (3!9) ÷ (9+1) ≅ 8 circuit/pin, |
| mJTR = | 44% and 75% of the words of SJ(N) have a |
| JTR ≧ | 56% > 50% with an average of |
| μJTR = | 61%; |
| mKTR = | 50% and 100% of the words of SK(N) have a |
| KTR ≧ | 50%, with an average of |
| μKTR = | 62%. |

TABLE XIV

| CASE N = 9 (Second Possibility) |
| --- |
| (9!9) = | 1: | 1 1 1 1 1 1 1 1 1, 1 1 1 1 1 1 1 1 1 |
| (8!9) = | 9: | 0 1 1 1 1 1 1 1 1, 1 0 1 1 1 1 1 1 1 |
| (7!9) = | 36: | 0 0 1 1 1 1 1 1 1, 1 0 0 1 1 1 1 1 1 |
| (6!9) = | 84: | 0 0 0 1 1 1 1 1 1, 1 0 0 0 1 1 1 1 1 |
| (5!9) = | 126: | 0 0 0 0 1 1 1 1 1, 1 0 0 0 0 1 1 1 1 |
| (4!9) = | 126: | 0 0 0 0 0 1 1 1 1, 1 0 0 0 0 0 1 1 1 |
| (3!9) = | 84: | 0 0 0 0 0 0 1 1 1, 1 0 0 0 0 0 0 1 1 |
| (2!9) = | 36: | 0 0 0 0 0 0 0 1 1, 0 1 1 1 1 1 1 0 0 |
| (1!9) = | 9: | 0 0 0 0 0 0 0 0 1, 0 1 1 1 1 1 1 1 0 |
| (0!9) = | 1: | 0 0 0 0 0 0 0 0 0, 0 1 1 1 1 1 1 1 1 |
| Total 512 = 2*9 = 2*N. | | |

Circuit PLA is personalized according to formula:

$$\overline{IT} = \overline{A}\,\overline{B}\,\overline{C}\,\overline{D}\,\overline{E}\,\overline{F}\,\overline{G} + \overline{A}\,\overline{B}\,\overline{C}\,\overline{D}\,\overline{E}\,\overline{F}\,\overline{H} + \ldots + \overline{C}\,\overline{D}\,\overline{E}\,\overline{F}\,\overline{G}\,\overline{H}\,\overline{I}$$

a sum of 36 logic products (36=7!9).

TABLE XV

| | |
| --- | --- |
| Δpin = | (1÷9) = 11%, |
| TC = | (2!9) (9+1) ≅ 4 circuit/pin |
| mJTR = | 33% and 59% of the words of SJ(N) have a |
| JTR ≧ | 56% > 50% with an average of |
| μJTR = | 55% |
| mKTR = | 40% and 84% of the words of SK(N) have a |
| KTR ≧ | 50% with an average of |
| μKTR = | 59%. |

In short, since the data unit is comprised of the 8-bit byte (with or without the parity), a data bus with no parity checking, will be divided into 8-bit words and each word will be subject to the change summarized in tables XI and XII; and a data bus with parity checking (one parity bit for each byte) will be divided into 9-bit words and each of the words will be subject to the change summarized in tables XIV and XV.

With this method, optimization between parameters Δpin,
TC and
μKTR
is insured.

As a final consideration, even if the actual circuits, used for implementing the herein described process, are of the analog kind, like in FIGS. 3 thru 5, their logic implementation, previously discussed, may very well fulfill an objective of building either a model or a prototype for testing and/or simulating/emulating the real circuits.

Furthermore, this logic implementation, though detailed here by the means of a PLA, may very well be of any other kind, provided it satisfies the same logic equations; e.g. random logic made of AND/OR/NOT gates, or NAND gates, or NOR gates, of any circuit types, etc.

While the invention has been shown in preferred form, it will be appreciated by those skilled in the art that modifications and changes may be made to the process and the network for its implementation without departing from the spirit of the invention.

What we claim is:

1. A method for transmitting digital data signals from a first integrated circuit to a second integrated circuit, the first integrated circuit having multiple output devices which produce the data signals by assuming either a conductive or non-conductive state, the second integrated circuits having inputs for receiving the data signals, the method comprising:

analyzing the data signals of the first circuit to determine the number of first circuit output devices in a conductive state;

generating a control signal to invert the data signals produced by the first circuit when the number of output devices in a conductive state is equal to or greater than a pre-determined number and to not invert the data signals when the number of output devices in a conductive state is less than the predetermined number;

transmitting the data signals to the second circuit either inverted or non-inverted in accordance with the control signal;

transmitting the control signal to the second circuit; and establishing the data signals as they originally appeared at the first circuit output devices in response to the control signal before the data signals are introduced to the second circuit inputs.

2. The method of claim 1 wherein the control signal for inverting the data signals is generated when the number of first circuit output devices conducting is equal to or greater than the number of first circuit output devices not conducting.

3. The method of claim 1 wherein the data signals of the first circuit output devices are delayed during the generation of the control signal.

4. The method of claim 3 wherein the data signals are buffered and either inverted or not inverted in response to the control signal as the data signals are transmitted to the second circuit.

5. An electronic network for transmitting data signals from a first integrated circuit to a second integrated circuit, the first integrated circuit having multiple output devices which produce the data signals by assuming either a conductive or non-conductive state, the second integrated circuit having inputs for receiving the data signals, the network comprising:

a control signal generating circuit having inputs electrically connected to the first integrated circuit outputs, the control signal generator also having an output at which a control signal is provided, the control signal assuming a first state requiring inversion of the data signals when the number of output devices of the first integrated circuit conducting is equal to or greater than a predetermined number and the control signal assuming a second state requiring non-inversion of the data signals when the number of output devices of the first integrated circuit conducting is less than the pre-determined number;

a driver-inverter circuit having inputs for receiving the data signals and the control signal, the driver-inverter having an output for transmitting the data signals inverted or not inverted in response to the control signal and for also transmitting the control signal;

a receiver-inverter circuit having inputs for receiving the data signals inverted or uninverted, and the control signal, the receiver-inverter circuit re-inverting the data signals or not re-inverting the data signals in response to the control signal, the receiver-inverter circuit having outputs connected to the inputs of the second circuit for presenting the data signals at the inputs of the second integrated circuit as they originally appeared at the outputs of the first integrated circuit; and a transmission circuit for electrically coupling the data signals and control signal from the driver-inverter to the receiver-inverter.

6. The network of claim 5 wherein the control signal generator circuit has multiple inputs each individually connected to an output device of the first integrated circuit for generating a control signal to invert the data signals when the number of output devices of the first integrated circuit conducting is equal to or greater than the number not conducting.

7. The network of claim 6 further including a delay circuit having multiple inputs each individually connected to an output device of the first integrated circuit and outputs connected to the driver-inverter inputs for providing the data signals to the driver-inverter when the control signal is presented to the driver-inverter.

8. The network of claim 7 wherein the driver-inverter has multiple inputs, some of which are connected individually to the delay circuit outputs for receiving the delayed data signal and some of which are connected to the control signal generator for receiving the control signal, the driver-inverter including a separate drive circuit for receiving and transmitting the control signal over the transmission circuit.

9. The network of claim 8 wherein the receiver-inverter has multiple inputs at least some of which are individually connected to the transmit circuit for receiving the data signals, the receiver-inverter additionally including a control signal receive circuit having an input connected to the transmission circuit for receiving the control signal the control signal receiver circuit having an output electrically connected to at least some of the receiver-inverter multiple inputs, the receiver-inverter having multiple outputs individually connected to an input of the second integrated circuit.

10. The network of claim 5 wherein the control signal generator circuit comprises;

a first circuit section for generating a monitor signal level representing the number of first integrated circuit output devices conducting;

a second circuit section for generating a reference signal level representing the maximum number of output devices of the first integrated circuit permitted to be simultaneously conducting;

and a differential amplifier circuit section for receiving the monitor signal level and the reference signal level, the differential amplifier section generating a control signal to invert the data signals when the reference signal level exceeds the monitor signal level and for generating a control signal not to invert the data signals when the monitor signal level exceeds the reference signal level.

11. The network of claim 10 wherein the driver-inverter includes multiple exclusive OR gate sections each having one input for receiving the delayed data signal and another input for receiving the control signal.

12. The network of claim 5, wherein the control signal generator circuit is a logic majority gate circuit.

13. The network of claim 12 wherein the control signal generator circuit is a programmable logic array.

* * * * *